United States Patent
Obara et al.

(10) Patent No.: US 7,166,163 B2
(45) Date of Patent: Jan. 23, 2007

(54) OPTICAL MEMBER, METHOD OF MANUFACTURING THE SAME, AND PROJECTION EXPOSURE SYSTEM

(75) Inventors: Hideki Obara, Machida (JP); Kazumasa Endo, Kawasaki (JP)

(73) Assignee: Nikon Corporation, Tokyo (JP)

( * ) Notice: Subject to any disclaimer, the term of this patent is extended or adjusted under 35 U.S.C. 154(b) by 142 days.

(21) Appl. No.: 10/973,260

(22) Filed: Oct. 27, 2004

(65) Prior Publication Data

US 2005/0081777 A1  Apr. 21, 2005

Related U.S. Application Data

(62) Division of application No. 10/276,434, filed as application No. PCT/JP02/02368 on Mar. 13, 2002, now Pat. No. 6,850,371.

(30) Foreign Application Priority Data

Mar. 15, 2001  (JP)  ............................. 2001-074127

(51) Int. Cl.
C30B 9/04 (2006.01)
C30B 7/08 (2006.01)
(52) U.S. Cl. ............................. 117/81; 117/82; 117/83
(58) Field of Classification Search ................ 117/81, 117/82, 83
See application file for complete search history.

(56) References Cited

U.S. PATENT DOCUMENTS 6,332,922 B1   12/2001   Sakuma et al.
6,683,714 B1   1/2004   Meda et al.

FOREIGN PATENT DOCUMENTS

| EP | 0 869 203 A2 | 10/1998 |
|---|---|---|
| EP | 0 939 147 A2 | 9/1999 |
| EP | 0 972 863 A1 | 1/2000 |
| EP | 0 995 820 A1 | 4/2000 |
| EP | 1 026 548 A2 | 8/2000 |
| JP | A 9-315894 | 12/1997 |
| JP | A 11-60382 | 3/1999 |
| JP | A 11-240798 | 9/1999 |
| JP | A 2000-256095 | 9/2000 |
| JP | A 2000-281492 | 10/2000 |

*Primary Examiner*—Felisa Hiteshew
(74) *Attorney, Agent, or Firm*—Oliff & Berridge PLC

(57) ABSTRACT

A method of manufacturing an optical member includes a crystal growing step and a carving step. The crystal growing step includes melting a mixture of fluoride powder and a scavenger at a melting temperature of a melting point for the fluoride and above, and then crystallizing the melted fluid and further cooling down an obtained fluoride crystal in a temperature range from 1000° C. to 900° C. by a temperature decreasing rate in a range from 0.1 to 5° C./hr. The carving step includes carving an optical member out of the fluoride crystal obtained in the crystal growing step such that the optical member is made of a fluoride crystal in which a maximum diameter $d_{max}$ of scattering bodies existing internally and a quantity $n_s$ of the scattering bodies per 1 cm³ satisfy a condition represented by the following formula (1):

$$0 < d_{max}^2 \times n_s < 6.5 \times 10^{-4} (\text{cm}^{-1}). \quad (1)$$

4 Claims, 4 Drawing Sheets

DENSITY OF QUANTITY OF SCATTERING BODIES (cm⁻³)

OPTICAL MEMBER, METHOD OF MANUFACTURING THE SAME, AND PROJECTION EXPOSURE SYSTEM

INCORPORATION BY REFERENCE

This is a Division of application Ser. Nos. 10/276,434 Nov. 15, 2002 U.S. Pat. No. 6,850,371, which is the U.S. National Stage of International Application No. PCT/JP02/02368 filed Mar. 13, 2002. The entire disclosure of the prior applications is hereby incorporated by reference herein in their entireties.

FIELD OF THE INVENTION

The present invention relates to optical members made of fluoride crystalline materials for use in ultraviolet and vacuum-ultraviolet regions with a wavelength of not more than 250 nm, a method of manufacturing the same, and projection exposure systems such as steppers or scanners which apply the optical members to optical systems.

BACKGROUND ART

In recent years, micro-fabrication technology on wafers has been requested along with development of higher integration and higher sophistication in VLSI (very large scale integration), and photolithographic technology has been widely used as a fabrication method therein. It is desirable that a projection lens of a projection exposure system, which is a key to the photolithographic technology, possesses high imaging performances (resolution and focal depth).

The resolution and the focal depth depend on a wavelength of light and on an NA (numerical aperture) of a lens which are used upon exposure. When an exposure wavelength $\lambda 0$ is constant, an angle of diffraction light grows larger as a pattern becomes finer. Accordingly, it is not possible to pick up the diffraction light unless the NA of the lens is large. Meanwhile, when the exposure wavelength $\lambda$ is short, the angle of the diffraction light in the same pattern becomes small. Accordingly, the NA of the lens can be made small.

The resolution and the focal depth are severally represented by the following formulae (2) and (3), namely, $$\text{Resolution} = k_1 \cdot \lambda / NA \quad (2)$$

$$\text{Focal depth} = k_2 \cdot \lambda / (NA)^2 \quad (3)$$

(in the formulae (2) and (3), $k_1$ and $k_2$ severally denote proportionality constants).

From the formula (2), it is learned that either the NA of the lens should be increased (that is, a diameter of the lens is increased) or the exposure wavelength $\lambda$ should be shortened in order to enhance the resolution, however, it can be said from the formula (3) that shortening $\lambda$ is particularly advantageous from the viewpoint of the focal depth.

Due to the foregoing reason, recently the exposure wavelength is gradually shortened, and a projection exposure system adopting a light source such as a KrF excimer laser (248-nm wavelength) or an ArF excimer laser (193-nm wavelength) is launched in the market. In such a system, optical materials usable for photolithography with a wavelength at 250 nm or less are extremely limited, and almost all optical systems are designed to use two types of materials which are calcium fluoride and fused silica.

Moreover, practical application of a projection exposure system using an $F_2$ laser (157-nm wavelength) is under consideration in order to exploit further shortening of the exposure wavelength. It is considered that materials usable under this wavelength are limited to certain fluoride crystals beside calcium fluoride, which are strontium fluoride, barium fluoride, lithium fluoride and the like.

Incidentally, it is known that an absorption band is generated in a single crystal of calcium fluoride when a laser beam with high photon energy is irradiated onto the single crystal of calcium fluoride containing a large degree of impurities. If an optical member using such a material is applied to an optical system, there is a case of incurring deterioration of transmittance in the used wavelength under the influence of the absorption band thus generated. Therefore, there is disclosed a use of a single crystal of calcium fluoride having high transmittance and durability with respect to an irradiated laser beam as calcium fluoride for photolithography (Japanese Patent Laid-Open No. 11(1999)-60382 and the like).

Next, speaking of an increase in the diameter of the lens, an optical material for use in photolithography which requires extremely high-level imaging performance is not only satisfied with a large diameter, but it is also essential that the optical material possesses small birefringence and excellent homogeneity in an internal refractive index.

The Bridgman method is generally used as the method of manufacturing calcium fluoride. Upon fabrication of an optical member from a calcium fluoride crystal ingot obtained by the Bridgman method, although there is a case of carving the optical member (material) of a targeted size directly out of the ingot, there is also a case of cutting the ingot into a plurality of blocks and then subjecting the blocks to a heat treating step so as to enhance internal quality such as birefringence and homogeneity in refractive index. For example, Japanese Patent Laid-Open No. 11(1999)-240798 discloses a method of manufacturing a single crystal of calcium fluoride, which has characteristics of birefringence in the direction of the optical axis at 2 nm/cm or below, birefringence in the lateral direction (the direction of an in-plane diameter perpendicular to the optical axis) at 5 nm/cm or below, and a refractive index difference $\Delta n$ at $2 \times 10^{-6}$ or below.

DISCLOSURE OF THE INVENTION

As described above, transmittance and durability with respect to a laser beam, as well as low birefringence and homogeneity in refractive index are required from the optical member. Particularly, the optical system of the projection exposure system used for photolithography enhances its resolution to the limit. Accordingly, it is usual that the optical system includes a substantial number of lenses for correction of wave front aberration and therefore has a long optical path length. Here, even if an amount of transmission loss (an amount of loss by scattering+an amount of loss by absorption) of a lens is minute, accumulation of such transmission losses on the whole optical system largely affects the optical performance of the system. For example, in an optical path length of 1 m (=100 cm), when the amount of transmission loss is only 0.5%/cm, intensity of light is reduced by $0.995^{100}$=0.606, that is, down to about 61% in the end. Accordingly, it is more favorable as internal transmittance comes closer to 100%/cm regarding the optical member used therein, and the internal transmittance is required to be at least 99.5%/cm and above, or preferably 99.8%/cm and above.

Now, an index for judging quality of a fluoride crystalline material such as calcium fluoride in terms of transmittance is so called inclusion, which is presence of defects inside the material. Although definition of the inclusion is not always clear, one aspect of the inclusion is observed as a luminous grain caused by light scattering in the event of watching under a spotlight. Such a grain is called a scattering body.

Here, if the scattering body exists in the material, the scattering body scatters the light and thereby deteriorates transmittance. Accordingly, in the case of a system composed of numerous optical members (lenses) such as an optical system used for photolithography, even if an optical member sufficient in the characteristic such as durability of transmittance with respect to a laser, an amount of birefringence or homogeneity in refractive index, there are possibilities of adverse influences such as insufficiency in throughput of the entire optical system, deterioration in contrast, occurrence of flares and ghosts, or the like.

For this reason, a fluoride crystalline material including the scattering bodies which are easily visible to the naked eye all over its surface is deemed as a defective product. Moreover, in a case of a fluoride crystalline material including local distribution of the scattering bodies, an optical member 3 with a small diameter, which is carved out of a portion 2b without the scattering bodies, is only used for the optical system as shown in FIG. 2. Here, the remaining portion inclusive of the scattering bodies 2a is deemed as a defective product.

In this way, the scattering body is a large factor in degradation of optical characteristics and a product yield of calcium fluoride for photolithography. Therefore, calcium fluoride as an optical member for photolithography and a projection exposure system using the calcium fluoride are extremely expensive.

Moreover, it is possible to carve out the portion without the scattering bodies selectively in the case of the optical member with a small diameter as described above. However, since the scattering bodies are included upon carving out an optical member of a large diameter (a diameter φ at 200 mm, for example), it is extremely difficult to achieve enhancement in the optical characteristics and an increase in the diameter of the optical member at the same time.

The present invention has been made in consideration of the above-mentioned problems of the prior art. It is an object of the present invention to provide an optical member which has sufficiently high optical characteristics (such as internal transmittance) with respect to light with a wavelength of not more than 250 nm and effectuates enhancement in a yield and an increase in a diameter upon carving out of a fluoride crystalline material, a method of manufacturing the same, and a projection exposure system using the optical member.

To attain the foregoing object, the inventors of the present invention has extended studies on quantitative relations between optical performances required for a fluoride crystalline material (such as calcium fluoride) usable as an optical member for photolithography and scattering bodies on the inside to begin with. As a result, the inventors have found out that an optical member carved out of a fluoride crystalline material is usable as an optical member for photolithography in spite of presence of scattering bodies therein in the case when the size and the number thereof satisfy given conditions, and have reached consummation of the present invention.

Specifically, an optical member of the present invention is an optical member for photolithography used together with light having a wavelength of not more than 250 nm, consisting essentially of a fluoride crystal in which a maximum diameter $d_{max}$ (cm) of scattering bodies existing internally and a quantity $n_s$ of the scattering bodies per 1 cm³ satisfy a condition represented by the following formula (1):

$$0 < d_{max}^2 \times n_s < 6.5 \times 10^{-4} (\text{cm}^{-1}) \quad (1)$$

According to the optical member of the present invention, the maximum diameter $d_{max}$ of the scattering bodies and the quantity $n_s$ thereof per 1 cm³ satisfy the condition represented by the foregoing formula (1), whereby optical performance (such as internal transmittance) with respect to the light having the wavelength of not more than 250 nm are maintained at a high level. Therefore, it is possible to enhance a yield upon carving out of the fluoride crystalline material and to increase a diameter thereof.

Note that the scattering body relevant to the present invention refers to an object which exists inside the optical member and is observed as a luminous grain caused by light scattering in the event of watching under a spotlight. To be more precise, the scattering bodies include vacuum or air bubbles, and impurities such as graphite or calcium oxide. These scattering bodies seldom have spherical shapes but generally have angular shapes.

Moreover, in the optical member of the present invention, it is preferable that the maximum diameter of the scattering bodies is not more than $2.0 \times 10^{-3}$ cm (20 μm) and the quantity of the scattering bodies per 1 cm³ is not more than 160, or alternatively, that the maximum diameter of the scattering bodies is not more than $4.0 \times 10^{-3}$ cm (40 μm) and the quantity of the scattering bodies per 1 cm³ is not more than 40. If these conditions are satisfied, it is possible to further enhance the optical performance such as the internal transmittance.

Moreover, it is preferable that the optical member of the present invention has a diameter φ of not less than 200 mm. Since the optical member of the present invention possesses the high-level optical performance as described previously, when it is feasible to increase the diameter as large as the diameter φ of 200 mm, it is possible to further enhance an imaging performance in photolithography using the light having the wavelength of not more than 250 nm.

Moreover, in the optical member of the present invention, it is severally preferable that an amount of birefringence in a direction of an optical axis is 2 nm/cm or below, that an amount of birefringence in a diametrical direction is not more than 5 nm/cm and that a refractive index difference Δn inside the member is not more than $2 \times 10^{-6}$. If these conditions are satisfied, it is possible to further enhance the imaging performance in the photolithography using the light having the wavelength of not more than 250 nm.

Moreover, in the optical member of the present invention, it is preferable that an amount of transmittance deterioration in a case of irradiating $10^6$ pulses of an ArF excimer laser beam having energy density of 50 mJ/cm²/pulse is not more than 2.0%/cm. If such a condition is satisfied, it is possible to further enhance the imaging performance in the photolithography using the light having the wavelength of not more than 250 nm.

Moreover, a method of manufacturing an optical member of the present invention includes a crystal growing step of melting a mixture of fluoride powder and a scavenger at a melting temperature of a melting point of the fluoride and above and then crystallizing the melted fluid and further cooling down an obtained fluoride crystal in a temperature range from 1000° C. to 900° C. by a temperature decreasing rate in a range from 0.1 to 5° C./hr, and a carving step of carving an optical member out of the fluoride crystal obtained in the crystal growing step such that the optical member is made of a fluoride crystal in which a maximum diameter $d_{max}$ (cm) of scattering bodies existing internally and a quantity $n_s$ of the scattering bodies per 1 cm³ satisfy a condition represented by the following formula (1):

$$0 < d_{max}^2 \times n_s < 6.5 \times 10^{-4} (\text{cm}^{-1}) \tag{1}$$

According to the manufacturing method of the present invention, the mixture of the fluoride powder and the scavenger is melted at a melting temperature no lower than the melting point of the fluoride, then the melted fluid is crystallized and the fluoride crystal thus obtained is cooled down in the temperature range from 1000° C. to 900° C. by the temperature decreasing rate in the range from 0.1 to 5° C./hr, whereby the maximum diameter $d_{max}$ (cm) of the scattering bodies contained in the fluoride crystal and the quantity $n_s$ of the scattering bodies per 1 cm³ are sufficiently reduced. Therefore, it is possible to obtain the optical member of the present invention as represented by the formula (1) easily and reliably by the manufacturing method of the present invention, and enhancement in a product yield and an increase in a diameter are thereby achieved.

Moreover, in the manufacturing method of the present invention, it is preferable that a position for carving the optical member out in the carving step is selected based on a correlation among the maximum diameter $d_{max}$ (cm) of the scattering bodies obtained in advance concerning light with a specified wavelength, the quantity $n_s$ of the scattering bodies per 1 cm³, and an amount of deterioration L of internal transmittance. In this way, it is possible to obtain the optical member having desired internal transmittance easily and reliably.

Moreover, in the manufacturing method of the present invention, it is preferable that the fluoride powder for use therein has an average grain size no greater than 100 μm, and a proportion of grains having grain sizes in a range from 0.5 to 1.5 times of the average grain size accounts for 50 weight % and above. It is possible to suppress generation of the scattering bodies by use of the above-described fluoride powder, and $n_s$ can be further reduced accordingly.

Moreover, in the manufacturing method of the present invention, it is preferable that concentrations of Cl, Br and I contained in the fluoride powder for use therein are severally below 0.1 ppm. In this way, it is possible to further reduce the maximum diameter $d_{max}$ (cm) of the scattering bodies contained in the fluoride crystal and the quantity $n_s$ of the scattering bodies per 1 cm³.

Moreover, a projection exposure system of the present invention includes a reticle having a pattern, an illumination optical system for irradiating light having a wavelength of not more than 250 nm onto the reticle, and a projection optical system for forming an image of the pattern on the reticle irradiated by the illumination optical system onto a wafer. Here, at least one of the illumination optical system and the projection optical system includes an optical member made of a fluoride crystal in which a maximum diameter $d_{max}$ (cm) of scattering bodies existing internally and a quantity $n_s$ of the scattering bodies per 1 cm³ satisfy a condition represented by the following formula (1):

$$0 < d_{max}^2 \times n_s < 6.5 \times 10^{-4} (\text{cm}^{-1}) \tag{1}$$

Deterioration in throughput of the optical system, deterioration in contrast, occurrence of flares and ghosts and the like are suppressed sufficiently by applying the optical member of the present invention to at least one of the illumination optical system and the projection optical system. Accordingly, it is possible to achieve a sufficiently high imaging performance in a case of using light having a wavelength of not more than 250 nm.

Moreover, in the projection exposure system of the present invention, it is preferable that the optical member has a diameter φ of not more than 200 mm. It is possible to further enhance the imaging performance by increasing the diameter of the optical member as described above.

BEST MODE FOR CARRYING OUT THE INVENTION

Figure 1:
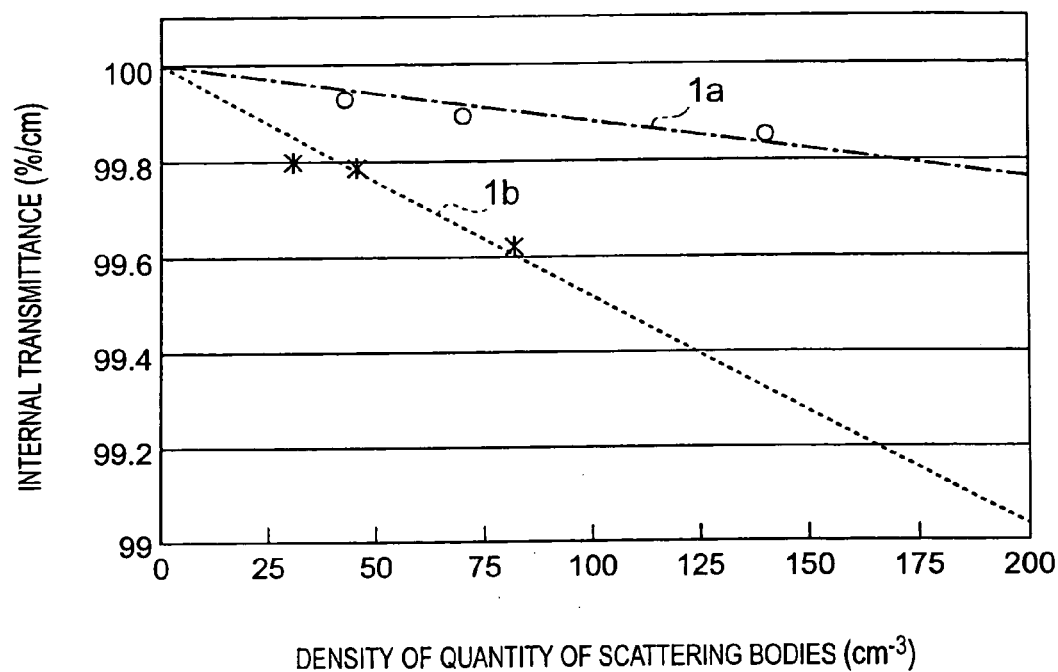
FIG. 1 is a graph showing one example of a relation between a quantity $n_s$ of scattering bodies per 1 cm³ of calcium fluoride and internal transmittance thereof.
Figure 2:
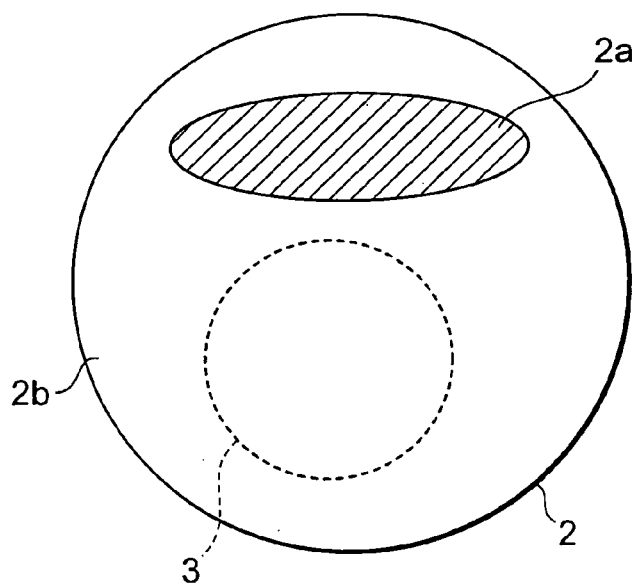
FIG. 2 is an explanatory view showing one example of a position for carving a conventional optical member out of a fluoride crystal.

In the following, description will be made in detail regarding a preferred embodiment of the present invention with reference to the accompanying drawings as appropriate.

As described above, an optical member of the present invention is an optical member for photolithography used together with light having a wavelength of not more than 250 nm. Here, the optical member is made of a fluoride crystal, in which a maximum diameter $d_{max}$ (cm) of scattering bodies existing internally and a quantity $n_s$ of the scattering bodies per 1 cm³ satisfy a condition represented by the following formula (1):

$$0 < d_{max}^2 \times n_s < 6.5 \times 10^{-4} (\text{cm}^{-1}) \tag{1}$$

Accordingly, the optical member possesses sufficient optical characteristics (such as internal transmittance) with respect to the light having the wavelength of not more than 250 nm.

Although fluoride crystal relevant to the present invention is not particularly limited as long as $d_{max}$ and $n_s$ satisfy the condition represented by the foregoing formula (1), a calcium fluoride crystal, a lithium fluoride crystal, a barium fluoride crystal, a strontium fluoride crystal, a magnesium fluoride crystal, and the like are cited to be more precise. It is preferable that these fluoride crystals are single crystals.

In the following, description will be made concretely regarding measurement of internal transmittance with respect to light having a wavelength at 193 nm and microscopic observation of scattering bodies in a case where calcium fluoride is the fluoride crystal, and quantification of a relation among the internal transmittance, and $d_{max}$ and $n_s$ of the scattering bodies based on results thereof.

First, concerning two types of calcium fluoride samples in which scattering bodies exist on the inside with given distribution, test pieces severally having the diameter of 30 mm are collected from a plurality of positions different in densities of scattering bodies. Each of these test pieces is subjected to mirror polishing so as to satisfy the condition where a distance (thickness) between two opposite and mutually parallel planes is 10 mm, parallelism is within 30 seconds, and surface roughness RMS is within 5 Å.

Regarding the test pieces thus obtained, transmittance at the wavelength of 193 nm is measured by use of a spectrophotometer (such as Cary 5 made by Varian, Inc.). The transmittance obtained here refers to transmittance including multiple reflection, which can be converted into internal transmittance by use of the following formulae (4) and (5).

Specifically, if a refractive index is denoted by n, then reflectance R on a surface of the test piece is represented by the following formula (4). Meanwhile, a relation between the transmittance $T_r$ in consideration of a multiple reflection loss on the surface and the internal transmittance $T_i$ is represented by the following formula (5) by use of R:

$$R=(n-1)^2/(n+1)^2 \qquad (4)$$

$$T_r=(1-R)^2 \cdot Ti/(1-R^2 \cdot T_i^2) \qquad (5)$$

In the formulae (4) and (5), it is possible to find the internal transmittance $T_i$ out of the transmittance $T_r$ inclusive of the multiple reflection which is obtained by the measurement of the transmittance, by means of applying the refractive index n=1.501 of calcium fluoride with respect to the light with the wavelength of 193 nm. For example, if $T_r$=92.3% then $T_i$=100.0%, and if $T_r$=91.4% then $T_i$=99.0%.

Next, microscopic observation of the scattering bodies is performed regarding positions where the measurement of the transmittance of the test pieces took place. Note that the Japanese Optical Glass Industrial Standards suggest that it is desirable to measure a cross-sectional area and a quantity by use of a sample in a size of 50 ml or larger upon observation of foreign substances or bubbles. However, it is extremely difficult to perform measurement of spectral transmittance by using such a large sample directly because of size restriction of a sample chamber or the like. Therefore, it is impossible to find a relation among the transmittance, and the size and the quantity of the scattering bodies directly. Accordingly, the inventors of the present invention have contemplated to find the relation between the scattering body and the transmittance by means of measuring the size and the quantity of the scattering bodies in the region where the transmittance of the test piece being subjected to the measurement of the transmittance was measured.

The maximum diameter $d_{max}$ of the scattering bodies and a quantity $n_s$ thereof per 1 cm$^3$ can be found by the following procedures. Specifically, upon observation of the optical member with a microscope (magnifications: 50, field of view: φ 4 mm), a stage mounting the test piece is moved up and down, whereby the quantity of the scattering bodies observed within the view fields in an interval of 10 mm from a front to a back of the test piece, and a maximum length of cross sections thereof are measured. The measurement is carried out six times in total while slightly changing the position of the test piece. Accordingly, it is possible to find $d_{max}$ and $n_s$ (which are average values in both cases) out of the quantities of the counted scattering bodies, areas of the fields of view and a moving distance (10 mm) of the stage. When such microscopic observation takes place, the diameter of the scattering bodies and the quantity thereof normally show different values depending on each ingot.

FIG. 1 is a graph showing one example of a relation between the quantity $n_s$ of the scattering bodies per 1 cm$^3$ of fluorite and internal transmittance, in which the axis of abscissas indicates $n_s$ and the axis of ordinates indicates the internal transmittance $T_i$. Marks ○ in the drawing represent plotted points of the internal transmittance $T_i$ with respect to the quantity $n_s$ of the scattering bodies regarding calcium fluoride in which the maximum diameter $d_{max}$ of the scattering bodies is 2.0×10$^{-3}$ cm (20 μm), and a line 1a is an approximated curve for those points. Meanwhile, marks * in the drawing represent plotted points of the internal transmittance $T_i$ with respect to the quantity $n_s$ of the scattering bodies regarding calcium fluoride in which the maximum diameter $d_{max}$ of the scattering bodies is 4.0×10$^{-3}$ cm (40 μm), and a line 1b is an approximated curve for those points.

As plotted in the graph, when the maximum diameter $d_{max}$ of the scattering bodies is constant, a linear relation is observed between the quantity $n_s$ of the scattering bodies and the internal transmittance $T_i$. The inventors of the present invention have further examined on a correlation among the maximum diameter $d_{max}$ as well as the quantity per 1 cm$^3$ of the scattering bodies and an amount of deterioration L of the internal transmittance $T_i$ per 1 cm, and have found out a correlation represented by the following formula (6) as a consequence:

$$L=d_{max}^2 \times n_s \times C_1 \qquad (6)$$

(in the formula (6), L denotes the amount of deterioration (%/cm) of the internal transmittance per 1 cm; $C_1$ denotes a coefficient when a thickness of a sample is 1 cm; and $d_{max}$ as well as $n_s$ severally denote the definition contents identical to those in the formula (1)).

In other words, regarding calcium fluoride which shows different correlations between $n_s$ and $T_i$ as shown in the straight lines 1a and 1b in FIG. 1, the amount of deterioration L of the internal transmittance can be expressed in one formula as the above-described formula (6) by considering the maximum diameter $d_{max}$ of the scattering bodies. Here, the coefficient $C_1$ is 3.1 when the wavelength of the light is 193 nm.

According to the formula (6), the internal transmittance $T_i$ exceeds 99.8%/cm when $d_{max}$ and $n_s$ satisfy a condition represented by the following formula (7):

$$0.998 < 1-d_{max}^2 \times n_s \times 3.1 (\text{cm}^{-1}) \qquad (7)$$

in other words, when $d_{max}$ and $n_s$ satisfy a condition represented by the following formula (8):

$$d_{max}^2 \times n_s < 6.5 \times 10^{-4} (\text{cm}^{-1}) \qquad (8)$$

Therefore, even in the case of the optical member made of calcium fluoride containing the scattering bodies therein, it is still possible to obtain excellent optical performance when used in an optical system for photolithography, provided, that the maximum diameter $d_{max}$ and the quantity $n_s$ of the scattering bodies satisfy the condition represented by the formula (8), that is, the formula (1).

To be more precise, from the formula (8) i.e. the formula (1), the internal transmittance of 99.8%/cm and above can be achieved if the quantity $n_s$ of the scattering bodies per 1 cm$^3$ is no more than 160 in the case where the maximum diameter of the scattering bodies present therein is 20 μm or smaller, or if the quantity $n_s$ of the scattering bodies per 1 cm$^3$ is no more than 40 in the case where the maximum diameter of the scattering bodies present therein is 40 μm or smaller.

Meanwhile, in the case where the internal transmittance $T_i$ should only satisfy 99.5%/cm or greater, then $d_{max}$ and $n_s$ should only satisfy a condition represented as the following formula (9):

$$0.995 < 1-d_{max}^2 \times n_s \times 3.1 (\text{cm}^1) \qquad (9)$$

in other words, $d_{max}$ and $n_s$ should only satisfy a condition represented by the following formula (10):

$$d_{max}^2 \times n_s < 1.6 \times 10^{-3} (\text{cm}^{-1}) \quad (10)$$

Although description has been made above regarding the example in the case of the ArF excimer laser beam (193-nm wavelength), the optical member of the present invention is also effective when used together with other light having a wavelength of not more than 250 nm, such as a KrF excimer laser beam (248-nm wavelength) or an $F_2$ laser beam (157-nm wavelength).

Next, description will be made regarding a method of manufacturing an optical member of the present invention.

In the method of manufacturing an optical member of the present invention, firstly a mixture of fluoride powder and a scavenger is melted at a melting temperature of a melting point for the fluoride and above, then the melted fluid is crystallized and an obtained fluoride crystal are further cooled down in a temperature range from 1000° C. to 900° C. by a temperature decreasing rate in a range from 0.1 to 5° C./hr (a crystal growing step).

As for the fluoride powder for use in the manufacturing method of the present invention, calcium fluoride, lithium fluoride, barium fluoride, strontium fluoride, magnesium fluoride, and the like are cited. It is preferable to remove impurity elements of metal or the like as much as possible out of the fluoride powder of the above-mentioned ingredients before subjecting the fluoride powder to a pre-processing step. For example, it is preferable that concentrations of chlorine (Cl), bromine (Br) and iodine (I) contained in the raw material are severally below 0.1 ppm. It is possible to further reduce the maximum diameter $d_{max}$ and the quantity $n_s$ per 1 cm$^3$ of the scattering bodies contained in the fluoride crystal if the fluoride powder used therein satisfies the condition regarding the concentrations of Cl, Br, and I as described above. Moreover, it is preferable that concentrations of cobalt (Co), cerium (Ce), lanthanum (La), yttrium (Y), iron (Fe) and lead (Pb) are severally below 0.5 ppm; concentrations of potassium (K), manganese (Mn), copper (Cu), nickel (Ni) and chromium (Cr) are severally below 0.1 ppm; concentrations of lithium (Li) and sodium (Na) are severally below 0.2 ppm; a concentration of barium (Ba) is below 1.0 ppm; and a concentration of strontium (Sr) is below 20 ppm.

Meanwhile, the scavenger has an effect of reducing concentrations of impurities in the fluoride powder. To be more precise, those cited are metal fluorides such as lead fluoride, zinc fluoride or silver fluoride, gaseous fluorides such as fluorine ($F_2$) or carbon tetrafluoride (tetrafluoromethane, $CF_4$), and fluorine-containing organic compounds such as PTFE (polytetrafluoroethylene). An amount of addition of the scavenger is not particularly limited; however, it is preferable to be in a range from 0.1 to 10 mol % with respect to the fluoride powder raw material in the case of a metal fluoride, for example. If the fluoride powder raw material is calcium fluoride and the scavenger is lead fluoride, for example, then it is preferable to use 0.3 to 35 g of lead fluoride with respect to 100 g of calcium fluoride.

In the event of performing the crystal growing step, it is preferable to subject the mixture of the fluoride powder and the scavenger to a given pre-process in advance so as to remove the impurities in the mixture and to increase a bulk density thereof. For example, it is possible to attempt homogenization of viscosity and components of a melted fluid obtained by filling the mixture of the fluoride powder and the scavenger into a crucible and then by heating and melting the mixture inside a given pre-processing apparatus. In this event, it is preferable to maintain the crucible and the inside of the pre-processing apparatus as clean as possible, and it is preferable to discharge air out of the apparatus before heating when the raw material is introduced. Moreover, it is preferable that the pre-processing step is performed in a clean room which maintains a cleanness factor better than class 1,000,000.

The processing temperature and retention time in the pre-processing step vary depending on the types of the fluoride powder and the scavenger. In the case where the fluoride raw material is calcium fluoride, for example, the temperature is preferably set in a range from 1420° C. to 1500° C., and the retention time is preferably set in a range from 12 to 36 hours. A reaction between the fluoride powder and the scavenger is promoted by performing the pre-process under the above-described condition, and the viscosity and the components of the melted fluid can be sufficiently homogenized. In this event, it is preferable that a temperature increasing rate in the process of heating up to the above-mentioned temperature is set in a range from 1 to 15° C./hr. Moreover, it is preferable that the temperature rise is stopped temporarily and held at a given temperature (preferably in a range from 150° C. to 350° C.) because the impurities such as water or carbon dioxide can be removed by evaporation.

In the pre-processing step, the melted fluid homogenized in the viscosity and the components is cooled down in accordance with a given temperature decreasing rate (preferably in a range from 10 to 30° C./min). Thereafter, the pre-processing step is finished upon completion of crystallization of the melted fluid, and the fluoride crystal thus obtained is subjected to the crystal growing process as raw material bulk.

The crystal growing step according to the present invention can be performed by the vertical Bridgman method, for example. Specifically, either the mixture of the fluoride powder and the scavenger or the fluoride crystal obtained in the preprocessing step is put into a crucible and then introduced into a crystal growth apparatus (a crystal growth furnace), and the fluoride crystal is melted at a melting temperature equal or above a melting point for the fluoride crystal (which is 1420° C. and above in the case of calcium fluoride). Thereafter, the crucible is pulled down from the furnace at a given rate for pulling down, whereby the melted fluid is crystallized.

Here, the melting temperature in the crystal growing step refers to the temperature of the melting point of the fluoride crystal or higher as described above, which is preferably set in a range from 1420° C. to 1500° C. in the case of calcium fluoride. Moreover, the retention time at the melting temperature is preferably set in a range from 8 to 24 hours.

Moreover, the rate for pulling down the crucible is preferably set in a range from 0.1 to 5 mm/hr. If the rate for pulling down exceeds the upper limit, the maximum diameter $d_{max}$ and the quantity $n_s$ per 1 cm$^3$ of the scattering bodies in the fluoride crystal tend to increase. On the contrary, manufacturing efficiency tends to drop if the rate falls below the lower limit.

Crystallization is completed normally in a range from 1200° C. to 1350° C. by pulling down the crucible as described above.

The obtained fluoride crystal is slowly cooled down to a given temperature (preferably in a range from 400° C. to 750° C.). Here, it is essential that the temperature decreasing rate in the event of cooling down from 1000° C. to 900° C. is set in a range from 0.1 to 5° C./hr. If the temperature decreasing rate in the temperature range exceeds the above-mentioned upper limit, the maximum diameter $d_{max}$ and the quantity $n_s$ per 1 cm$^3$ of the scattering bodies in the fluoride crystal are increased, then, it is extremely difficult to achieve enhancement in a yield and an increase in a diameter upon carving out the optical member of the present invention. Moreover, if the temperature decreasing rate is too fast as mentioned above, the fluoride crystal may break up easily because of development of cracks or the like, and homogeneity in the refractive index is deteriorated as well. On the contrary, productivity becomes inadequate if the temperature decreasing rate falls below the lower limit. Such a slow cooling step can be performed by means of setting the crucible once pulled down back to the crystal growth apparatus again while controlling the temperature inside the apparatus, for example.

Meanwhile, it is preferable that the temperature decreasing rate in the event of cooling down from the point of completion of the crystallization to 1000° C. is set in a range from 1 to 15° C./hr. If the temperature decreasing rate in the above-mentioned temperature range exceeds the upper limit, the fluoride crystal may break up easily because of development of cracks or the like, and homogeneity in the refractive index tends to be deteriorated as well. On the contrary, operability tends to be degraded if the temperature decreasing rate falls below the lower limit. For example, in the case of slowly cooling down the crystal ingot once pulled down by means of lifting it up closer to the central portion of the crystal growth apparatus, such rapid cooling down immediately after the crystallization is extremely difficult due to the structure of the furnace.

Furthermore, after the temperature of the fluoride crystal reached 900° C., it is possible to continue slow cooling with the same temperature decreasing rate or to perform multi-stage slow cooling with different temperature decreasing rates. However, in either case, the temperature decreasing rate in a temperature range from 900° C. to 750° C. is preferably set in a range from 0.1 to 5° C./hr (more preferably in a range from 0.2 to 2° C./hr), and the temperature decreasing rate from 750° C. down to completion of slow cooling is preferably set in a range from 1.0 to 15° C./hr. By slow cooling with the temperature decreasing rates as described above, it is possible to further enhance the effect of reducing the size and the quantity of the scattering bodies in the fluoride crystal, and to enhance the effect of preventing development of cracks and deterioration of homogeneity in the refractive index as well.

Note that it is preferable to perform removal of the fluoride crystal out of the crucible after the pre-processing step and filling of the fluoride crystal into the crucible in the growing step in a clean room which maintains a cleanness factor better than class 1,000,000 as similar to the pre-processing step in order to avoid interfusion of impurity elements or dust. It is also possible to prevent an increase of the scattering bodies attributable to disturbance from the environment outside the apparatus by means of disposing the crystal growth furnace in the clean room, which maintains the cleanness factor better than class 1,000,000, together with an earthquake-resistant structure, and by controlling the temperature inside the clean room to a given temperature (at 25±1° C., for example)

Moreover, although description has been made herein regarding the case of performing the pre-processing step and the crystal growing step separately, it is not always necessary to perform the pre-processing step and the crystal growing step separately in the manufacturing method of the present invention. For example, it is also possible to melt the mixture of the fluoride powder and the scavenger in the pre-processing step and then grow the crystal by pulling down the crucible containing the melted fluid while controlling the above-described temperatures or the temperature decreasing rates.

The optical member of the present invention can be obtained by carving a material of a desired shape out of the fluoride crystal (the ingot) thus obtained.

Figure 3:
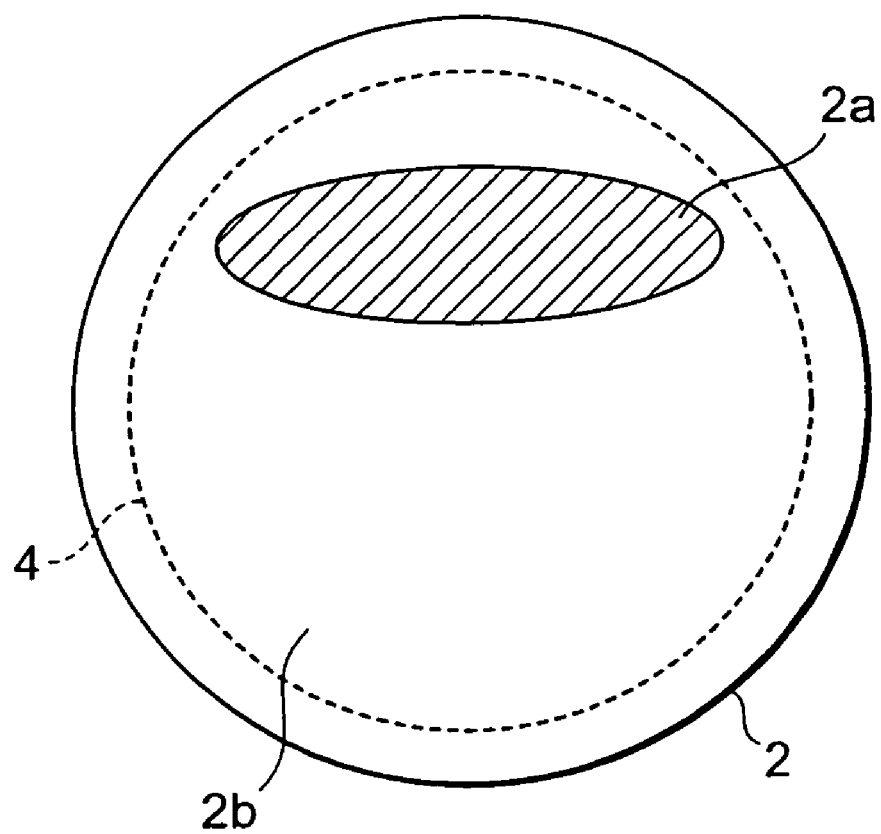
FIG. 3 is an explanatory view showing one example of a position for carving an optical member of the present invention out of a fluoride crystal.

A position for carving the optical member out of the fluoride crystal is selected based on measured values of the maximum diameter $d_{max}$ and the quantity $n_s$ per 1 cm$^3$ of the scattering bodies obtained by microscopic observation. Here, as the maximum diameter $d_{max}$ and the quantity $n_s$ per 1 cm$^3$ of the scattering bodies are sufficiently reduced in the fluoride crystal obtained by the manufacturing method of the present invention, it is possible to enhance the product yield and to increase the diameter. Specifically, as shown in FIG. 3, $d_{max}$ and $n_s$ at a portion 2a containing the scattering bodies satisfy the condition represented by the aforementioned formula (1) in the case of a fluoride crystal 2 obtained by the manufacturing method of the present invention. Accordingly, an obtained optical member 4 possesses sufficiently high optical performance if it is carved out while including the portion 2a so as to enhance the product yield and to increase the diameter.

Meanwhile, in the case of carving an optical member having certain internal transmittance with respect to light having a specific wavelength (such as light having a shorter wavelength than an $F_2$ laser beam), then the coefficient $C_1$ in the formula (6) with respect to the light is determined in advance. Thereafter, internal transmittance at a carving position can be estimated without measuring the internal transmittance but based on the formula (6) applying the $C_1$ value and the measured values of the maximum diameter $d_{max}$ and the quantity $n_s$ per 1 cm$^3$ of the scattering bodies obtained by microscopic observation of the ingot. In this way, it is possible to obtain the optical member with the desired optical performance easily and reliably.

Moreover, in the present invention, the optical member carved out of the fluoride crystal may be subjected to processes such as annealing or mirror polishing when necessary. In particular, as the atmosphere is fluorinated if annealing is performed in the presence of a fluorinating agent such as ammonium bifluoride, PTFE, $F_2$ and $CF_4$. Accordingly, it is possible to prevent oxidation of the fluoride crystal and to further reduce $d_{max}$ and $n_s$. Alternatively, a similar effect can be also obtained by replacing the inside of an annealing furnace with inert gas such as argon instead of using the fluorinating agent. Although a processing temperature in annealing varies depending on the type of the fluoride crystal, it is preferable to set the temperature in a range from 1000° C. to 1200° C. in the case of calcium fluoride, for example.

As described above, according to the manufacturing method of the present invention, the maximum diameter $d_{max}$ and the quantity $n_s$ per 1 cm$^3$ of the scattering bodies contained in the fluoride crystal can be sufficiently reduced. As a result, it is possible to achieve enhancement in the yield and an increase in the diameter upon carving the optical member of the present invention out of the fluoride crystal.

Next, description will be made regarding a projection exposure system of the present invention.

Figure 4:
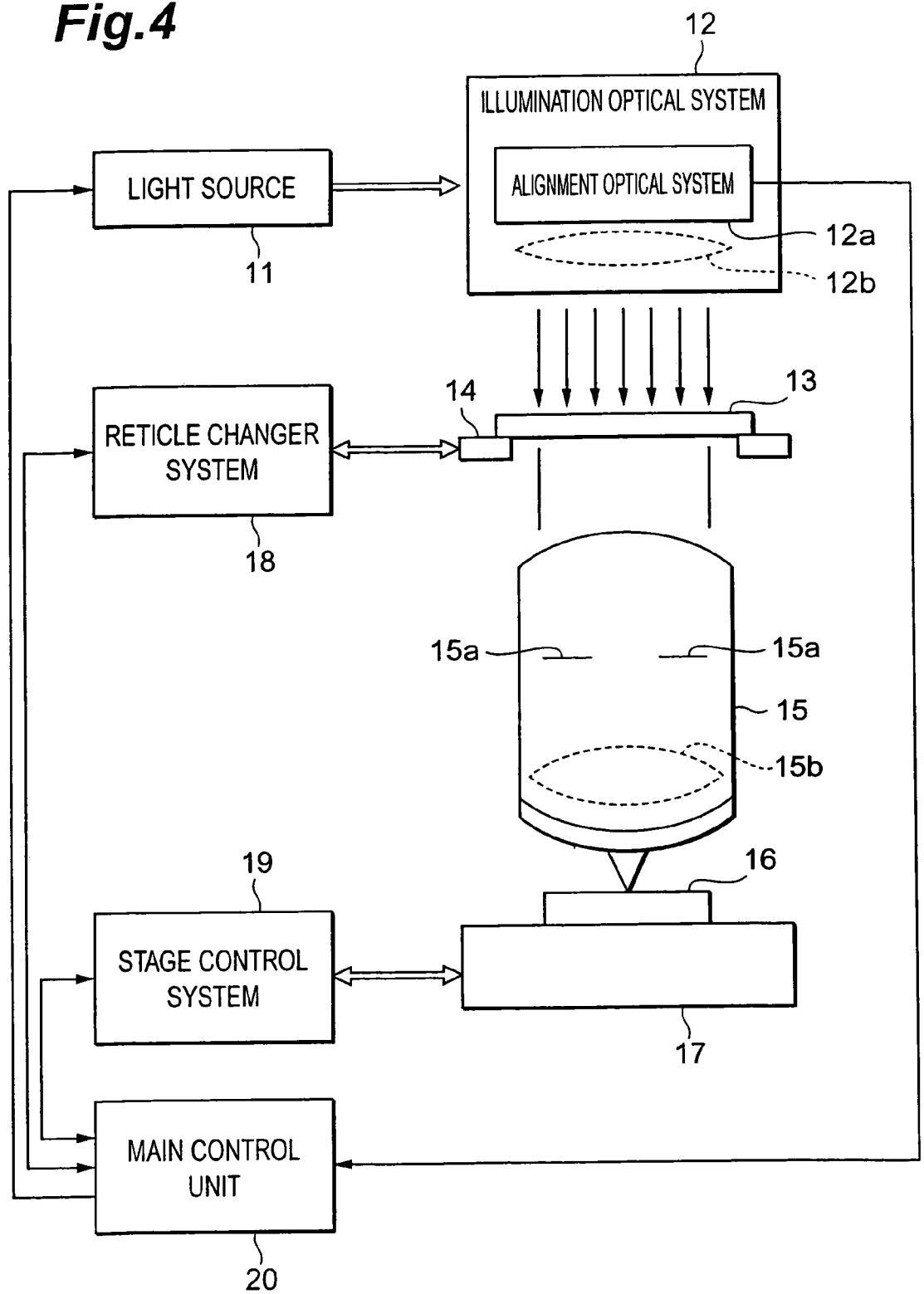
FIG. 4 is a schematic constitutional view showing one preferred embodiment of a projection exposure system of the present invention.

FIG. 4 is a schematic constitutional view showing one preferred embodiment of a projection exposure system of the present invention. In FIG. 4, reference numeral 11 denotes a light source, reference numeral 12 denoted an illumination optical system, reference numeral 12a denotes an alignment optical system, reference numeral 12b denotes an illumination lens, reference numeral 13 denotes a reticle, reference numeral 14 denotes a reticle stage, reference numeral 15 denotes a projection optical system, reference numeral 15a denotes an aperture, reference numeral 15b denotes a projection lens, reference numeral 16 denotes a wafer, reference numeral 17 denotes a wafer stage, reference numeral 18 denotes a reticle changer system, reference numeral 19 denotes a wafer stage control system, and reference numeral 20 denotes a main control unit.

As for the light source 11, a KrF excimer laser, an ArF excimer laser, an $F_2$ laser and the like are usable, for example. The light emitted out of the light source 11 forms uniform illumination light by the illumination lens in the illumination optical system 12, and illuminates a surface of the reticle 13 mounted on the reticle stage 14.

The light transmitted through a pattern provided on the reticle 13 further passes through the apertures 15a of the projection optical system 15, and then form an image of the pattern of the reticle 13 on a surface of the wafer 16. The illumination optical system 12 is provided with the alignment optical system 12a for adjusting a relative position between the reticle 13 and the wafer 16. Moreover, the reticle changer system 18 and the wafer stage control system 19 are provided as auxiliary equipment, and the entire system is controlled by the main control unit 20.

As described above, in the projection exposure system of the present invention, the light emitted out of the light source 11 passes through numerous optical members including the alignment optical system 12a, the illumination lens 12b, the projection lens 15b and the like. Here, sufficiently high optical performances with respect to the light having a wavelength of not more than 250 nm can be achieved by using the optical member of the present invention as the optical member for at least one of the illumination optical system 12 and the projection optical system 15, or further for the alignment optical system 12a.

Meanwhile, the illumination optical system 12 or the projection optical system 15 may be composed by including optical members (lenses) made of calcium fluoride crystals which do not satisfy the condition represented by the formula (1). However, it is preferable that an optical path length of the optical member of the present invention accounts for 10% and above (more preferably 50% and above) of an aggregate sum of optical path lengths of the optical members made of calcium fluoride. By constructing the optical systems so as to satisfy the foregoing condition, throughput of the entire optical systems are further enhanced, also, deterioration in contrast as well as occurrence of flares and ghosts can be prevented more reliably.

Figure 5:
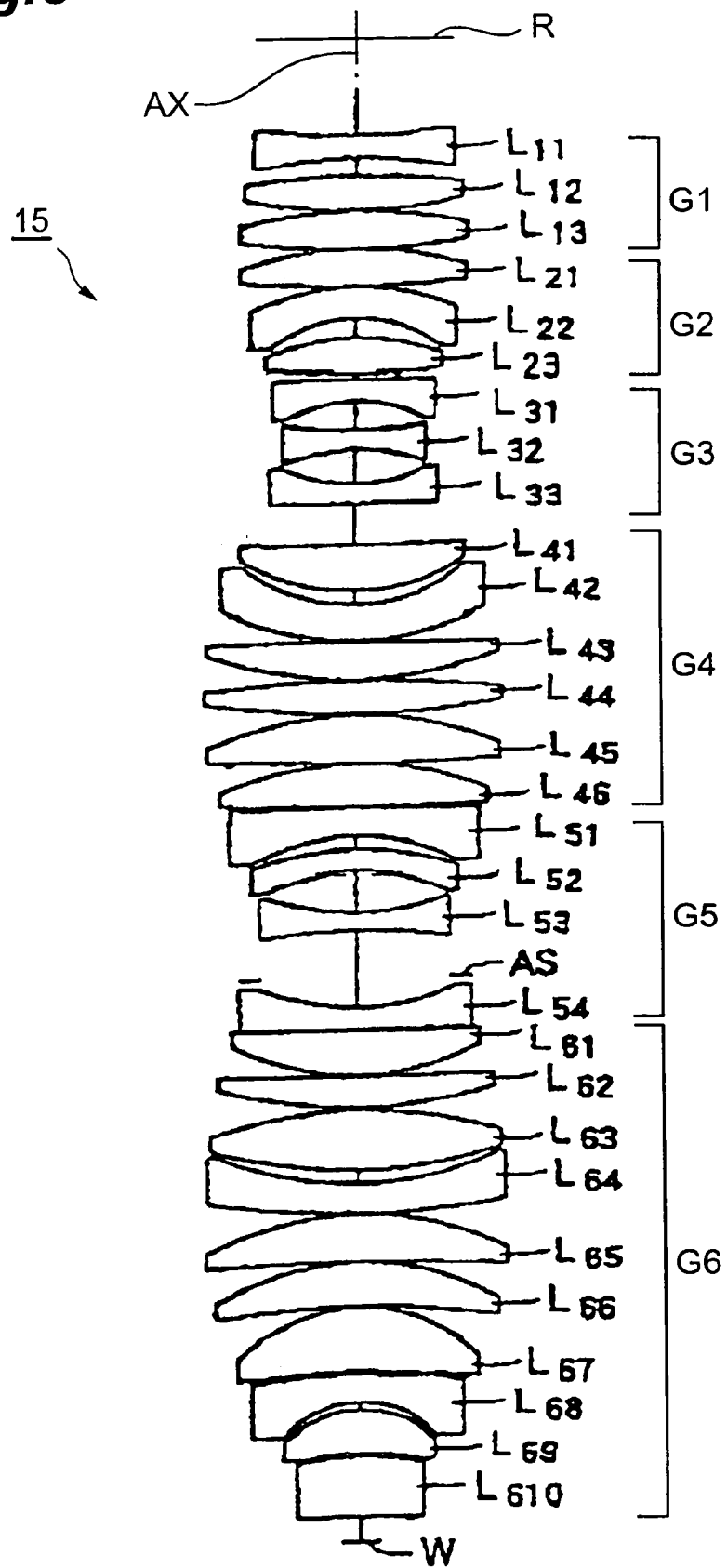
FIG. 5 is a schematic constitutional view showing one preferred example of a projection optical system according to the present invention.

Now, description will be made further in detail regarding the projection optical system 15 composed by use of the optical member of the present invention with reference to FIG. 5. FIG. 5 is a schematic constitutional view showing one preferred example of the projection optical system 15 according to the present invention. In the order starting from a reticle R side as a first object, the projection optical system 15 sequentially includes a first lens group G1 of positive power, a second lens group G2 of positive power, a third lens group G3 of negative power, a fourth lens group G4 of positive power, a fifth lens group G5 of negative power, and a sixth lens group G6 of positive power. Moreover, the object side (the reticle R side) and an image side (a wafer W side) are made almost telecentric, and the projection optical system possesses reductive power. Moreover, N. A. of this projection optical system is 0.6 and projected magnification is ¼.

In this projection optical system, six lenses $L_{45}$, $L_{46}$, $L_{63}$, $L_{65}$, $L_{66}$ and $L_{67}$ adopt ones made of fluoride crystals, and the rest of the lenses adopt ones made of fused silica. In this case, it is preferable that the optical path length of the optical member of the present invention accounts for 10% and above (more preferably 50% and above) of an aggregate sum of optical path lengths of the six lenses made of calcium fluoride. It is particularly preferable that all the six lenses are the optical members of the present invention.

EXAMPLES

The present invention will be hereinafter described more concretely based on examples and comparative examples. However, it is to be noted that the present invention is not limited to the following examples in any respect.

Example 1

(Fabrication of Optical Member)

Impurity elements such as metal were removed to the utmost from 50 kg of calcium fluoride powder (average grain size: 40 μm, a proportion of grains having sizes no smaller than 0.5 times and no larger than 1.5 times of the average grain size: 57%, concentrations of impurities: Cl<0.1 ppm, Br<0.1 ppm, I<0.1 ppm, Co<0.05 ppm, Ce<0.05 ppm, La<0.05 ppm, Y<0.05 ppm, Mn<0.1 ppm, Cu<0.1 ppm, Ni<0.1 ppm, K<0.1 ppm, Cr<0.1 ppm, Li<0.2 ppm, Na <0.2 ppm, Pb<0.5 ppm, Fe<0.5 ppm, Ba<1.0 ppm, Sr<20 ppm) . 1.6 kg of lead fluoride (about 1 mol %) was added as a scavenger thereto and agitation was satisfactorily performed. The mixture was put into a crucible made of carbon, which was held in a clean condition by rinsing with calcium fluoride powder. Then the crucible was introduced into a pre-processing apparatus which was cleaned and held in a clean condition. After the inside of the apparatus was pumped out to vacuum, the temperature was increased and maintained at 300° C. for a given time period, whereby impurities such as water or carbon dioxide were removed by evaporation. Next, the temperature was increased slowly so as to promote a sufficient reaction between the calcium fluoride powder and the scavenger. The calcium fluoride was melted at 1420° C., and the temperature was maintained at the same level for 24 hours to promote homogenization of viscosity and components of the melted fluid. Thereafter, the temperature inside the apparatus was decreased to crystallize the melted fluid.

Next, the step of growing a calcium fluoride crystal by the vertical Bridgman method was carried out in accordance with the following procedures.

First, the calcium fluoride crystal obtained in the pre-processing step was used as raw material bulk and put into a crucible made of carbon, which was held in a clean condition by rinsing with calcium fluoride powder. Then the crucible was introduced into a crystal growth apparatus which was cleaned and held in a clean condition. The inside of the apparatus was pumped out to vacuum and then the temperature was slowly increased under control by heating with a heater. When the temperature inside the apparatus reached 1420° C., the temperature was maintained for 24 hours to promote homogenization of the melted fluid. Thereafter, the crucible was pulled down by a pulling down rate of 1 mm/hr to promote crystallization.

After the melted fluid was entirely crystallized, the crucible was placed back into the crystal growth apparatus. The temperature inside the apparatus was slowly cooled down to room temperature under control, whereby a crystal ingot of the calcium fluoride was obtained. Temperature decreasing rates upon slow cooling were set severally as: 3° C./hr until reaching 1000° C., 1° C./hr from 1000° C. down to 900° C., and 5° C./hr from 900° C. down to 500° C. The ingot was further cooled down from 500° C. to the room temperature by leaving the ingot uncontrolled in the furnace.

The inside of the ingot thus obtained was observed under a spotlight. Although scattered light from scattering bodies was observed, the scattered light was less in a lower half of the ingot than an upper half thereof.

A material of 200-mm diameter and 50-mm thickness was carved out of the lower half of the ingot and introduced into an annealing furnace together with a fluorinating agent (ammonium bifluoride). After the inside of the furnace was pumped out to vacuum, the temperature was increased to 1050° C. by a temperature increasing rate of 50° C./hr and maintained at the same level for 24 hours. Thereafter, the material was slowly cooled down to 900° C. by a temperature decreasing rate of 2° C./hr and further down to room temperature by a temperature decreasing rate of 5° C./hr. A targeted optical member was thereby obtained.

A maximum diameter $d_{max}$ and a quantity $n_s$ per 1 cm$^3$ of the scattering bodies contained in the obtained optical member, internal transmittance with respect to light having a wavelength at 193 nm (the ArF excimer laser beam), an amount of birefringence in the direction of the optical axis or the diametrical direction, a refractive index difference and an amount of transmittance deterioration are shown on Table 1. The value of $d_{max}^2 \times n_s$ in the optical member obtained in this example was $$(1.8 \times 10^{-3})^2 \times 150 = 4.9 \times 10^{-4} < 6.5 \times 10^{-4} (\text{cm}^{-1})$$

and was therefore confirmed to satisfy the condition represented by the formula (1). Meanwhile, the internal transmittance with respect to the light having the wavelength at 193 nm showed a high value of 99.9%/cm.

Example 2

1.6 kg of lead fluoride (about 1 mol %) was added as a scavenger to 50 kg of calcium fluoride powder similar to example 1 and agitation was satisfactorily performed. The mixture was put into a crucible made of carbon, which was held in a clean condition by rinsing with calcium fluoride powder. Then the crucible was introduced into a pre-processing apparatus which was cleaned and held in a clean condition. Here, the above-mentioned operations were performed inside a clean room of class 10,000 in order to avoid interfusion of impurity elements or dust in the event of mixing and agitation and in the event of filling the raw material.

After the inside of the apparatus was pumped out to vacuum, the temperature was maintained at 300° C. for a given time period, whereby impurities such as water or carbon dioxide were removed by evaporation. Next, the temperature was increased slowly so as to promote a sufficient reaction between the calcium fluoride powder and the scavenger. The calcium fluoride was melted at 1420° C., and the temperature was maintained at the same level for 24 hours to promote homogenization of viscosity and components of the melted fluid. Thereafter, the temperature inside the apparatus was decreased to crystallize the melted fluid.

Next, the step of growing a calcium fluoride crystal by the vertical Bridgman method was carried out in accordance with the following procedures.

First, the calcium fluoride crystal obtained in the pre-processing step was used as raw material bulk and put into a crucible made of carbon, which was held in a clean condition by rinsing with calcium fluoride powder. Then the crucible was introduced into a crystal growth apparatus which was cleaned and held in a clean condition. Here, the operations of removing the fluoride crystal out of the crucible after the pre-processing step and filling of the fluoride crystal into the crucible in the growing step in a clean room were performed inside the clean room of class 10,000 in order to avoid interfusion of impurity elements or dust. Moreover, the crystal growth apparatus is provided with an earthquake-resistant structure and disposed inside the clean room of class 100,000, and the temperature inside the clean room was controlled to 25±1° C., whereby an increase of the scattering bodies attributable to disturbance from the environment outside the apparatus was prevented.

After the inside of a sample chamber of this crystal growth apparatus was pumped out to vacuum, the temperature was slowly increased under control by heating with a heater. When the temperature reached 1420° C., the temperature was maintained for 24 hours to promote homogenization of the melted fluid. Thereafter, the crucible was pulled down by a pulling down rate of 0.3 mm/hr to promote crystallization.

After the melted fluid was entirely crystallized, the crucible was placed back into the crystal growth apparatus. The temperature inside the apparatus was slowly cooled down to room temperature under control, whereby a crystal ingot of the calcium fluoride was obtained. Temperature decreasing rates upon slow cooling were set severally as: 3° C./hr until reaching 1000° C., 1° C./hr from 1000° C. down to 900° C., and 5° C./hr from 900° C. down to 500° C. The ingot was further cooled down from 500° C. to the room temperature by leaving the ingot uncontrolled in the furnace.

The inside of the ingot thus obtained was observed under a spotlight. Although scattered light from scattering bodies was observed in an upper part of the ingot, the scattered light was not observed in a lower half of the ingot.

Materials each having 200-mm diameter and 50-mm thickness were carved severally out of the upper half and the lower half of this ingot and introduced into an annealing furnace together with a fluorinating agent. After the inside of the furnace was pumped out to vacuum, the temperature was increased to 1050° C. by a temperature increasing rate of 50° C./hr and maintained at the same level for 24 hours. Thereafter, the materials were slowly cooled down to 900° C. by a temperature decreasing rate of 2° C./hr and further down to room temperature by a temperature decreasing rate of 5° C./hr. Targeted optical members were thereby obtained.

A maximum diameter $d_{max}$ and a quantity $n_s$ per 1 cm$^3$ of the scattering bodies contained in the obtained optical members, internal transmittance with respect to light having a wavelength at 193 nm (the ArF excimer laser beam), amounts of birefringence in the direction of the optical axis or the diametrical direction, refractive index differences and amounts of transmittance deterioration are shown on Table 1.

No scattering body was observed in the case of the optical member carved out of the upper half of the ingot, and the internal transmittance, the amounts of birefringence in the direction of the optical axis or the diametrical direction, the refractive index difference and the amount of transmittance deterioration thereof were also confirmed to be excellent. Moreover, the value of $d_{max}^2 \times n_s$ in the optical member carved out of the lower half was $$(3.6 \times 10^{-3})^2 \times 27 = 3.5 \times 10^{-4} < 6.5 \times 10^{-4} (\text{cm}^{-1})$$

and was therefore confirmed to satisfy the condition represented by the formula (1). Meanwhile, the internal transmittance with respect to the light having the wavelength at 193 nm showed a high value of 99.9%/cm.

Comparative Example 1

An optical member was fabricated as similar to example 1, except that the environment of preservation of the crucible, the pre-processing apparatus and the crystal growth apparatus was not administered, and that the temperature decreasing rate from the point of crystallization down to 500° C. was set to 30° C./hr in the crystallizing step.

A maximum diameter $d_{max}$ and a quantity $n_s$ per 1 cm³ of the scattering bodies contained in the obtained optical member, internal transmittance with respect to light having a wavelength at 193 nm (the ArF excimer laser beam), amounts of birefringence in the direction of the optical axis or the diametrical direction, a refractive index difference and an amount of transmittance deterioration are shown on Table 1.

The value of $d_{max}^2 \times n_s$ in the optical member obtained in this comparative example was $$(5.7 \times 10^{3-})^2 \times 30 = 9.7 \times 10^{-4} > 6.5 \times 10^{-4} (cm^{-1})$$

and was not therefore confirmed to satisfy the condition represented by the formula (1). Meanwhile, the internal transmittance with respect to the light having the wavelength at 193 nm was 99.7%/cm.

Comparative Example 2

An optical member was fabricated as similar to example 1, except that the temperature decreasing rate from the point of crystallization down to 500° C. was set to 30° C./hr in the crystallizing step.

A maximum diameter $d_{max}$ and a quantity $n_s$ per 1 cm³ of the scattering bodies contained in the obtained optical member, internal transmittance with respect to light having a wavelength at 193 nm (the ArF excimer laser beam), amounts of birefringence in the direction of the optical axis or the diametrical direction, a refractive index difference and an amount of transmittance deterioration are shown on Table 1.

The value of $d_{max}^2 \times n_s$ in the optical member obtained in this comparative example was $$(1.8 \times 10^{-3})^2 \times 290 = 9.4 \times 10^{-4} > 6.5 \times 10^{-4} (cm^{-1})$$

and was not therefore confirmed to satisfy the condition represented by the formula (1). Meanwhile, the internal transmittance with respect to the light having the wavelength at 193 nm was 99.7%/cm.

TABLE 1

| | | Example 1 | Example 2 | Comparative Example 1 | Comparative Example 2 |
|---|---|---|---|---|---|
| Scattering body | Maximum diameter $d_{max}$ (μm) | 18 | 36 | 57 | 18 |
| | Quantity $n_s$ | 150 | 27 | 30 | 290 |
| | Internal transmittance (%/cm) | 99.9 | 99.9 | 99.7 | 99.7 |
| Birefringence | Optical axis direction | 0.9 | 1.9 | 1.7 | 1.4 |

TABLE 1-continued

| | | Example 1 | Example 2 | Comparative Example 1 | Comparative Example 2 |
|---|---|---|---|---|---|
| (nm/cm) | Diametrical direction | 2.3 | 4.4 | 3.9 | 3.8 |
| | Refractive index difference | $1.2 \times 10^{-6}$ | $1.8 \times 10^{-6}$ | $1.8 \times 10^{-6}$ | $1.5 \times 10^{-6}$ |
| | Transmittance deterioration (%/cm) | 0.6 | 0.2 | 0.5 | 1.2 |
| | Overall judgment | Good | Good | NG | NG |

(Fabrication of Projection Exposure System)

Example 3

Among the lenses constituting the projection optical system shown in FIG. 5, the optical member of example 1 was applied to six lenses $L_{45}$, $L_{46}$, $L_{63}$, $L_{65}$, $L_{66}$ and $L_{67}$, and lenses made of fused silica (internal transmittance including loss by scattering: about 99.8%) were applied to the rest of the lenses. Accordingly, a projection exposure system shown in FIG. 4 was fabricated.

As a result of evaluation of an imaging performance of this projection exposure system, desired throughput (135 sheets/hr) was achieved in the case of ϕ200-mm wafers. Moreover, flares and ghosts observed therein accounted for about 1% as light noises, which were almost ignorable in practical use.

Comparative Example 3

Another projection exposure system was fabricated as similar to example 3, except that the optical member obtained in comparative example 1 was applied instead of the optical member of example 1.

As a result of evaluation of an imaging performance of this projection exposure system, overall transmittance of the projection optical system was higher than example 3 by about 5%, and the desired throughput was not achieved. Moreover, flares and ghosts observed therein accounted for about 7% as light noises.

INDUSTRIAL APPLICABILITY

As described above, according to the present invention, provided are an optical member having sufficiently high optical characteristics (such as internal transmittance) with respect to light with a wavelength at 250 nm or less and being capable of enhancing a yield and increasing a diameter upon carving out of a fluoride crystalline material, a method of manufacturing the same, and a projection exposure system using the optical member. Therefore, the present invention realizes a high-level imaging performance in microfabrication technology on a wafer.

What is claimed is:

1. A method of manufacturing an optical member, the method comprising:
    a crystal growing step of melting a mixture of fluoride powder and a scavenger at a melting temperature of a melting point for a fluoride and above, and then crystallizing a melted fluid and further cooling down an obtained fluoride crystal in a temperature range from 1000° C. to 900° C. by a temperature decreasing rate in a range from 0.1 to 5° C./hr; and a carving step of carving an optical member out of the fluoride crystal obtained in the crystal growing step such that the optical member is made of a fluoride crystal in which a maximum diameter $d_{max}$ of scattering bodies existing internally and a quantity $n_s$ of the scattering bodies per 1 cm³ satisfy a condition represented by the following formula (1):

$$0 < d_{max}^2 \times n_s < 6.5 \times 10^{-4} (\text{cm}^{-1}) \quad (1).$$

2. The method of manufacturing an optical member according to claim 1, wherein a position for carving the optical member out in the carving step is selected based on a correlation among the maximum diameter $d_{max}$ (cm) of the scattering bodies obtained in advance concerning light with a specified wavelength, the quantity $n_s$ of the scattering bodies per 1 cm³, and an amount of deterioration L of internal transmittance.

3. The method of manufacturing an optical member according to claim 1, wherein the fluoride powder to be used has an average grain size of 100 µm and below, and a proportion of grains having grain sizes in a range from 0.5 to 1.5 times of the average grain size accounts for 50 weight % and above.

4. The method of manufacturing an optical member according to claim 1, wherein the fluoride powder to be used has concentrations of Cl, Br and I severally below 0.1 ppm.

* * * * *